United States Patent
Platzer

(10) Patent No.: US 6,261,734 B1
(45) Date of Patent: Jul. 17, 2001

(54) PEEL-DEVELOPABLE SINGLE SHEET COLOR PROOFING SYSTEM WITH LAMINATED ADHESIVE LAYERS

(75) Inventor: Stephan J. W. Platzer, Eltville (DE)

(73) Assignee: AFGA Corporation, Ridgefield Park, NJ (US)

( * ) Notice: Subject to any disclaimer, the term of this patent is extended or adjusted under 35 U.S.C. 154(b) by 0 days.

(21) Appl. No.: 08/456,588

(22) Filed: Jun. 1, 1995

Related U.S. Application Data

(62) Division of application No. 07/894,168, filed on Jun. 3, 1992, which is a continuation of application No. 07/544,559, filed on Jun. 27, 1990, now abandoned.

(51) Int. Cl.⁷ ........................................ G03C 3/00
(52) U.S. Cl. .................. 430/253; 430/143; 430/254; 430/257; 430/293
(58) Field of Search .................................. 430/253, 254, 430/257, 143, 293

(56) References Cited

U.S. PATENT DOCUMENTS

| | | | |
|---|---|---|---|
| 3,721,557 | 3/1973 | Inoue . | |
| 4,304,836 | 12/1981 | Cheema et al. | 430/252 |
| 4,396,700 | 8/1983 | Kitajima et al. | 430/253 |
| 4,596,757 | 6/1986 | Barton et al. | 430/257 |
| 4,650,738 | 3/1987 | Platzer et al. | 430/143 |
| 4,659,642 | 4/1987 | Platzer et al. | 430/143 |
| 4,910,120 | 3/1990 | Platzer et al. | 430/253 |
| 5,100,757 | 3/1992 | Platzer et al. | 430/143 |
| 5,108,868 | 4/1992 | Platzer | 430/143 |

*Primary Examiner*—Christopher G. Young
(74) *Attorney, Agent, or Firm*—Robert & Mercanti, LLP

(57) ABSTRACT

This invention relates to positive working, peel apart, photopolymerizable sheet constructions which, upon exposure to an actinic radiation source through a screened image, can accurately reproduce said image. The construction is useful as a color proofing film which can be employed to accurately predict the image quality from a lithographic printing process. The method applies an adhesive to a temporary support and then laminates it to a receiver with removal of the temporary support. A photosensitive layer on a support is laminated to the adhesive, exposed, and peeled apart to form a positive image. Additional adhesive layers and photosensitive layers are similarly processed to provide a full color reproduction.

22 Claims, No Drawings

PEEL-DEVELOPABLE SINGLE SHEET COLOR PROOFING SYSTEM WITH LAMINATED ADHESIVE LAYERS

This is a divisional of application Ser. No. 07/894,168 filed on Jun. 3, 1992 which is a continuation of Ser. No. 07/544,559 filed on Jun. 27, 1990, now abandoned.

BACKGROUND OF THE INVENTION

In the graphic arts, it is desirable to produce a three or more color proof to assist in correcting a set of color separation film prior to using them to produce printing plates. The proof should reproduce the color quality that will be obtained during the printing process. The proof must be a consistent duplicate of the desired halftone image. Visual examination of a color proof should show the color rendition to be expected from press printing using the color separations and any defects on the separations which might need to be altered before making the printing plates.

Coloring proofing sheets for multicolored printing can be made by using a printing press or proof press. This requires that all of the actual printing steps be performed. Therefore, this conventional method of color proofing is costly and time consuming.

Photoimaging processes can also be used to produce a color proof. There are two general types of photoimaging methods, namely the overlay type and the single sheet type.

In the overlay type of color proofing method, an independent transparent plastic support is used for producing an image of each color separation film by applying a photosensitive solution of the corresponding color. A plurality of such supports carrying images of the corresponding colors are then superimposed upon each other over a white sheet to produce a color proofing composite. The primary advantage of the overlay method is that proofs can be made quickly and can serve as a progressive proof by combining any two or three colors in register. However, this type of color proofing method has the disadvantage that the superimposed plastic supports tend to darken the color proofing sheet. As a result, the impression of the color proofing composite thus prepared is vastly different from that of copies actually obtained with conventional printing presses and with proof presses. Examples of such overlay approaches are contained in U.S. Pat. Nos. 3,136,637; 3,211,553; and 3,326,682.

In the single sheet type of color proofing method, a color proofing sheet is prepared by successively producing images of different colors from different color separation films on a single receiver sheet. This can be accomplished by sequentially applying colorants or colored, photosensitive layers to a single opaque support. This method more closely resembles the actual printing process and eliminates the color distortion inherent in the overlay system. Examples of such single sheet approaches are contained in U.S. Pat. Nos. 3,671,236; 4,260,673; 4,366,223; 4,650,738; 4,656,114; and 4,659,642.

U.S. Pat. No. 3,574,049 provides a thermal transfer process for printing a design on a final support which comprises (a) printing a design onto a temporary support, (b) superimposing the temporary support and the final support, (c) applying heat and/or pressure to the superimposed structure formed in (b), and (d) separating the temporary support from the final support which retains the printed design. The affinity of the matter of the design towards the final support is greater than its affinity towards the temporary support. This process has the disadvantage of a printing step.

Various processes for producing single sheet color proofs of an image embodying thermal transfer and photopolymerization techniques are known, for example, from U.S. Pat. Nos. 3,060,023; 3,060,024; 3,060,025; 3,481,736; and 3,607,264. In these processes, a photopolymerizable layer coated on a suitable support is imagewise exposed through a color separation film. The surface of the exposed layer is then pressed into contact with an image receptive surface of a separate element. At least one of the said elements is heated to a temperature above the transfer temperature of the unexposed portions of the layer. The two elements are then separated, whereby the thermally transferrable, unexposed, image areas of the composite transfer to the image receptive element. If the element is not precolored, the tacky unexposed image may now be selectively colored with a desired toner. The colored matter preferentially adheres to the clear unpolymerized material.

In U.S. Pat. No. 3,721,557, a method for transferring colored images is claimed which provides a stripping layer coated between a photosensitive element and a support. When the photosensitive layer is exposed to actinic light and developed, the more soluble portions are selectively removed to produce a visible image. The image carrying support is pressed against a suitable adhesive coated receptor member and the carrier support is subsequently stripped to accomplish the transfer of the image. A fresh layer of adhesive must be applied to the receptor for each subsequent transfer.

U.S. Pat. No. 4,596,757 provides a method for transferring images or solid colors which are subsequently imaged. The photosensitive material comprises a carrier support having sequentially disposed thereon a release layer; a colored, photopolymerizable layer; and an adhesive layer. The material can undergo exposure, lamination to a temporary support, wet development, and then lamination to a receptor sheet. Alternatively, the photosensitive material can be laminated to a receptor sheet, undergo exposure, and then wet processed. Both processes require development in an aqueous medium.

In U.S. Pat. No. 4,489,154, a process is claimed which produces a single layer color proof without wet development. The photosensitive material comprises a strippable cover sheet; a colored photoadherent layer; a nonphotosensitive organic contiguous layer; and a sheet support. The material is exposed and peel developed. The positive or negative image is transferred to a receiver base. A fresh layer of adhesive must be applied to the receptor for each subsequent transfer.

SUMMARY OF THE INVENTION

The present invention provides a method for producing a positive image on a single sheet which comprises, in order:
  a) providing a receiver sheet; and
  b) providing an adhesive transfer article comprising a substrate having a release surface and an adhesive layer on said release surface, which adhesive layer comprises a thermoplastic resin or resins; and
  c) laminating said adhesive transfer article via the adhesive layer to the receiver sheet with pressure at a temperature in the range of from about 60° C. to about 120° C.; and
  d) peeling apart the substrate and the receiver sheet, thereby transferring the full adhesive layer from the substrate to the receiver sheet; and
  e) providing a photosensitive article which comprises a transparent support and a photosensitive composition layer on said support, said photosensitive composition comprising an organic binding resin, a colorant, a photoinitiator, and a free radical polymerizable acrylate or methacrylate component having at least two ethylenically unsaturated groups; wherein the binding resin is present in sufficient amount to bind the composition components into a uniform film; wherein the colorant is present in sufficient amount to uniformly color the composition; wherein the photoinitiator is present in sufficient amount to initiate the free radical polymerization of the polymerizable component upon exposure to sufficient actinic radiation; and wherein the polymerizable component is present in sufficient amount to provide an image differentiation when the composition is exposed to actinic radiation; and f) either
   1) laminating the photosensitive composition layer to the adhesive layer on the receiver sheet and thereafter imagewise exposing the photosensitive composition layer to sufficient actinic radiation to provide an image differentiation; or
   2) imagewise exposing the photosensitive composition layer to sufficient actinic radiation to provide an image differentiation and thereafter laminating the photosensitive composition layer to the adhesive layer on the receiver sheet; and thereafter g) peeling apart the transparent support and the receiver sheet such that the imagewise nonexposed portions of the photosensitive composition are transferred to the adhesive layer on the receiver sheet, thereby producing a positive image on the receiver sheet, while the imagewise exposed portions remain on the transparent support. In the preferred embodiment, an additional adhesive layer is laminated on top of this image and a second image is similarly produced on the same receiver sheet. Additional adhesive layers and other colored layers are sequentially processed on top of the previous layers until a full color reproduction is attained.

In the usual case, the printer prefers to prepare a proof directly on a paper stock which is similar or identical to the printing paper to be ultimately used. However, the adhesive layer, which is selected so that the photosensitive composition layer precisely breaks at the correct interface to form an image, may not adhere properly to some paper stocks. Therefore, in one particularly preferred embodiment, one may prepare the surface of the paper stock receiver sheet of choice. The adhesive layer will then adhere to the surface modified paper stock and will cause the photosensitive composition layer to properly break on the desired paper stock. This is accomplished by first laminating a high peel strength adhesive layer onto the paper stock.

DETAILED DESCRIPTION OF THE PREFERRED EMBODIMENT

In the usual full color proofing guide, four distinct colored images are formed, namely magenta, cyan, yellow, and black. When the images are superimposed upon each other, a simulated full color reproduction results. As hereinbefore described, one begins the process of the present invention by preparing a photosensitive element which has a support and carried thereon a colored, photopolymerizable layer.

In the preferred embodiment, the support may be composed of any suitable flexible sheet material provided it is transparent to the actinic radiation for the photopolymerizable layer. It should also preferably be dimensionally stable when treated with the herein specified processes. That is, it should have substantially no change in dimensions under heating in the range of approximately 60° C. to 120° C. during lamination. One preferred material is polyethylene terephthalate. In the usual case, it has a thickness of approximately 20 to 200 um and a more preferred thickness of approximately 50 to 80 um. The surface of the support may be smooth or it may be provided with a matte texture as on Melinex 475, which is available from ICI. A smooth surface is preferred because it does not scatter the actinic radiation and thereby does not reduce the resolution capability of the photosensitive layer. Suitable films with smooth surfaces nonexclusively include Melinex 054, 504, 505, 516 and 582 available from ICI, and Hostaphan 4400, 4500, and 4540 available from Hoechst Celanese Corporation.

The preferred films are surface modified on one side or on both sides. Such modifications of the transparent support are preferred to increase the adhesion of the exposed areas of the photosensitive coating to the support. This results in an improved dot reproduction. Therefore, as defined within the context of this invention, an adhesion promoted surface is one wherein the surface has been modified to make it more receptive to the light exposed areas of the photosensitive coating. Such surface modifications including using a flame, electrical discharge, chemical etch, and surface coatings.

The surface coatings for adhesion promotion modify the surface without contributing any mechanical or optical film properties of their own. They are commonly incorporated during the manufacturing process of the support. They may be monomolecular thick but are generally several layers thick. The dried surface coatings are extremely thin, preferably between about 0.001 um and about 0.1 um, and therefore not self supporting. They are strongly bonded to the transparent support such that these surface coatings completely remain with the support during peel development. In other words, they are not partially nor wholly removed from the support during peel development. Examples of surface modifying coatings are disclosed in U.S. Pat. Nos. 3,751,280; 3,819,773; 4,066,820; 4,098,952; 4,391,767; 4,486,483; 4,493,872; and 4,515,863. The preferred surface coating is a crosslinked polymer or copolymer of acrylic acid or methacrylic acid or their esters with a thickness of about 0.003 um.

The adhesion promoter is by definition not an adhesive. An adhesive is defined for the purpose of this invention to be a material which flows and wets both surfaces of the elements to which it adheres and fills in the gaps of their surfaces under suitable conditions of temperature and pressure. An adhesion promoter may act in this manner when it is applied to one surface but does not flow to the other surface.

Surface coatings which are thicker than 0.1 um are not suitable for this application because thick coatings change the mechanical properties of the support and interfere with the optical clarity of the support. They may also absorb monomers from the photosensitive layer, cohesively fail during peel development, release from the support during peel development, and prevent good adhesion of subsequent adhesive layers.

The colored, photosensitive layer is applied from a solvent coating composition to the support, preferably to the adhesion pretreated side of the support. Organic solvents are preferred for the photosensitive coating because of the diverse solubility characteristics of the various components. Typical solvents nonexclusively include methyl ethyl ketone, 2-methoxyethanol, 1-methoxy-2-propanol, 4-hydroxy-4-methyl-2-pentanone, tetrahydrofuran, and gamma-butyrolactone.

A typical photosensitive layer comprises a polymerizable monomer, photoinitiator, colorant, binder, and optional ingredients.

The polymerizable material contained in the colored, photosensitive layer preferably comprises an addition polymerizable, nongaseous (boiling temperature above 100° C. at normal atmospheric pressure), ethylenically unsaturated compound containing at least two terminal ethylenically unsaturated groups, and being capable of forming a high molecular weight polymer by free radical initiated, chain propagating addition polymerization. Suitable polymerizable materials nonexclusively include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerythritol triacrylate, bisphenol A ethoxylate dimethacrylate, trimethylolpropane ethoxylate triacrylate, and trimethylolpropane propoxylate triacrylate.

Free radical liberating photoinitiators include any compound which liberates free radicals on stimulation by actinic radiation. Preferred photoinitiators nonexclusively include quinoxaline compounds as described in U.S. Pat. No. 3,765,898; and vicinal polyketaldonyl compounds in U.S. Pat. No. 2,367,660; the alpha-carbonyls in U.S. Pat. Nos. 2,367,661 and 2,367,670; the acyloin ethers in U.S. Pat. No. 2,448,828; the triarylimidazolyl dimers in U.S. Pat. No. 3,479,185; the alpha-hydrocarbon substituted aromatic acyloins in U.S. Pat. No. 2,722,512; polynuclear quinones in U.S. Pat. Nos. 2,951,758 and 3,046,127; and s-triazines in U.S. Pat. No. 4,656,272. The most preferred is 2,3-(di-4-methoxyphenyl) quinoxaline.

Dyes and/or pigments are included in the photosensitive layer to provide color to the image areas. Preferred colorants for this invention are pigments rather than dyes. Light fast colorants are preferred. The pigments are typically dispersed with an organic binder in an organic solvent or mixture of organic solvents. The pigments may be organic or inorganic. They are ground to a small enough particle size to duplicate the particle size and color of equivalent inks. The median diameter is generally less than 1 micrometer.

Nonexclusive examples of colorants usable in the present invention are as follows: Permanent Yellow G (C.I. 21095), Permanent Yellow GR (C.I. 21100), Permanent Yellow DHG (C.I. 21090), Permanent Rubine L6B (C.I. 15850:1), Permanent Pink F3B (C.I. 12433), Hostaperm Pink E (73915), Hostaperm Red Violet ER (C.I. 46500), Permanent Carmine FBB (12485), Hostaperm Blue B2G (C.I. 74160), Hostaperm Blue A2R (C.I. 74160), and Printex 25. Most of these pigments are products of Hoechst AG. They can be used separately or blended for a desired color.

The photosensitive layer also contains a binder which not only determines the hardness and/or flexibility of the coating but is also used to control the dry development. For example, the colored layer will remain with its support in the exposed and nonexposed areas if the binder readily adheres to the transparent support and if too much of the binder is present. If the binder readily releases from the support and if too much of this type of binder is present, then the colored layer will be totally transferred to the adhesive.

Binders found suitable for the photosensitive layer are styrene/maleic anhydride copolymers and their half esters; acrylic polymers and copolymers; polyamides; polyvinyl pyrrolidones; cellulose and its derivatives; phenolic resins; and the like. The most preferred binders are polyvinyl acetals, such as polyvinyl butyral and polyvinyl propional. The most preferred binders are polyvinyl formals which are commercially available from Monsanto as Formvar. The formal content of the polyvinyl formals is approximately 65 to 86% expressed as % polyvinyl formal. The acetate content is approximately 9 to 30% expressed as % polyvinyl acetate. The hydroxyl content is approximately 5 to 7% as expressed as % polyvinyl alcohol. The average molecular weight is between about 10,000 and about 200,000. The most preferred binder is Formvar 12/85.

Dyes may be included to spectrally sensitize the photoinitiator, such as described in U.S. Pat. Nos. 4,282,309 and 4,454,218, and European Patent Applications 0,179,448 and 0,211,615.

Other ingredients which may be present in the photosensitive layer are thermal polymerization inhibitors, plasticizers, oligomers, residual solvents, surfactants, inert fillers, antihalation agents, hydrogen atom donors, photoactivators, and optical brightening agents.

In the preferred embodiment, the dry photosensitive layer has a coating weight range between the approximately 0.1 and 5 g/m$^2$. The more preferred coating weight is between approximately 0.4 to 2 g/m$^2$.

In the practice of the present invention, the photopolymerizable monomer component is preferably present in the photosensitive layer in an amount ranging from approximately 10 to 60% based on the weight of the solids in the layer. A more preferred range is from approximately 15 to 40%.

In the practice of the present invention, the photoinitiator component is preferably present in the photosensitive layer in an amount ranging from approximately 2 to 30% based on the weight of the solids in the layer. A more preferred range is from approximately 6 to 20%.

In the practice of the present invention, the colorant component is preferably present in the photosensitive layer in an amount ranging from approximately 10 to 50% based on the weight of the solids in the layer. A more preferred range is from approximately 15 to 35%.

In the practice of the present invention, the binder component is preferably present in the photosensitive layer in an amount ranging from approximately 10 to 75% based on the weight of the solids in the layer. A more preferred range is from approximately 20 to 50%.

The adhesive transfer article is prepared by coating a layer of a suitable adhesive composition onto a substrate having a release surface. The purpose of the adhesive layer is to aid in the transfer of the nonexposed, image portions of the photosensitive coating to the receiver upon peel development, and to protect the integrity of underlying, previous formed images during dry development of subsequent layer(s). The application of the adhesive to the substrate may be accomplished in several different ways. Usually, the adhesive is coated on top of the substrate out of organic solvents which do not have any solubilizing or deleterious effect on the substrate. Such solvents include methanol, ethanol, methyl ethyl ketone, n-butyl acetate and iso-butyl acetate. Acrylic polymers and copolymers, such as Elvacite 2044 and 2028 from DuPont, can be coated out of organic solvents. Likewise, polyamides such as Ultramid 1C from BASF can be coated out of alcohols. Polyvinyl acetate polymers and copolymers are more preferred due to their adhesive properties to paper. Polyvinyl acetates are available from Hoechst AG as Mowiliths. These resins have a average molecular weight between 35,000 and 2,000,000. They have a softening temperature between 80 and 180° C. The most preferred adhesive is Mowilith 60. In the preferred embodiment, the polyvinyl acetate is present in the adhesive layer in an amount of greater than approximately 50 percent by weight. Other adhesives may be coated out of water mixtures. Polymers with high acid numbers, such as Carboset 525 from B.F. Goodrich, Mowilith Ct5A from Hoechst and Erkarex 1144 from Robert Kramer can be coated out of ammonium hydroxide:water mixtures. Alternatively, some adhesives may be coated as aqueous emulsions. Examples of aqueous emulsions include polyvinyl acetate copolymers such as Mowilith DM-6 and DM-22 from Hoechst AG; Vinac XX-210 and 465 DEV from Air Products; and polyvinyl butyral dispersions such as Butvar BR from Monsanto. Some adhesives may be applied by hot melt extrusion. Suitable adhesives for this method of application include the polyethylene/vinyl acetate copolymers, such as Elvax 40-W and 150-W from Du Pont. The adhesive resin should have a softening temperature in the range of approximately 40 to 200° C., more preferably 60 to 120° C. The preferred adhesive layer comprises a resin or resins with glass transition temperatures of from about −25° C. to about 100° C. The layer may optionally contain such other desired components as UV absorbers, antistatic compositions, optical brighteners, inert fillers, surfactants, release agents, residual solvents, elastomers, monomers and plasticizers. Suitable plasticizers include phthalates, nonexclusively including dibutyl phthalate, butyl benzyl phthalate, and dimethyl phthalate. Polymeric plasticizers, such as Resoflex R-296 available from Cambridge Industries, may also be used. The plasticizer may be present in the adhesive layer in an amount of up to approximately 30 percent by weight.

The substrate for the adhesive transfer article comprises a sheet material which is dimensionally stable under the laminating conditions and chemically stable under the adhesive application conditions. These nonexclusively include polyesters, particularly polyethylene terephthalate. The substrates may be transparent or opaque, clear or colored. In the usual case, it has a thickness of from about 20 um to about 250 um, a more preferred thickness is from about 50 um to about 130 um, and most preferably from about 50 um to about 80 um. Suitable films nonexclusively include Hostaphan 3000 available from Hoechst Celanese, Mylar D available from DuPont, and Melinex 516 available from ICI. The surface of the substrate may be smooth or may be provided with a matte texture by various methods known in the art. Example of matte films include Melinex 377 and 470 available from ICI. The substrate must have a release surface, that is, it must be capable of releasably holding the adhesive layer thereto. This may be accomplished by either the substrate surface being inherently releasable, being rendered releasable by a suitable treatment, or being provided with a release layer over the substrate surface. Such a release layer may comprise polyvinyl alcohol or poly (dimethylsiloxane). A preferred substrate having a release surface is Melinex 516, which is a slip pretreated polyethylene terephthalate film from ICI.

In the preferred production of the adhesive transfer article, a solution of the adhesive polymer is initially coated onto the release surface of the substrate. Then the dried adhesive layer may be laminated to the receiver base. The substrate is then removed by peeling, and the complete adhesive layer remains on the receiver base. In the preferred embodiment, the dry adhesive layer has a coating weight range between approximately 2 and 30 g/m². The more preferred coating weight is between approximately 4 and 15 g/m². The thickness of the adhesive may be adjusted to regulate the apparent dot size of the final proof.

Receiver bases may comprise virtually any material which can withstand the laminating and dry development processes. White plastic sheets, such as adhesion pretreated polyester Melinex 3020 from ICI, are useful for this purpose. Plastic coated paper sheets, such as polyethylene coated paper from Schoeller, may also be used. Preferably, the receiver sheet is normal printing paper, such as Mead 25 (70) and Champion Kromekote 1S. Other bases may include wood, glass, paper, metal, and the like. The first adhesive layer down may not transfer properly to coarse paper if the adhesive layer is thin. Therefore, the surface of the paper receiver sheet is prepared for better adhesion by applying a thicker higher peel strength adhesive layer to it. It is desired to pretreat the receiver sheet with such a high peel strength adhesive layer so that the printer may use virtually any receiver base for practicing this invention. The High peel strength adhesive article is prepared and applied to the receiver in the same manner as the above described adhesive transfer article except that alternative adhesive polymers are used. The high peel strength adhesive layer comprises a thermoplastic resin or resins selected such that the adhesive layer prepared has a peel strength to the receiver of about 100 g/inch or more, preferably greater than 200 g/in, and most preferably greater than 500 g/in, as measured at a peel speed of 10 in/min and peel angle of 160°. These resins preferably have a glass transition temperature in the range from about −20° C. to about 25° C. Copolymers containing vinyl acetate groups are preferred as the thermoplastic resin. In particular, vinyl acetate/ethylene copolymers with a vinyl acetate mole percentage in the range between 15% and 90% are useful as thermoplastic resins in the high peel strength adhesive layer. Examples of such resins nonexclusively include Airflex 465 DEV available from Air Products, and Elvax 150-W available from DuPont. Also, vinyl acetate/acrylate copolymers, such as Mowilith DM6, can be employed as the thermoplastic resins. The layer may optionally contain other desired components like uv absorbers such as Uvinul D-50 available from GAF; plasticizers such as Resoflex R-296 available from Cambridge Industries; antistatic compounds such as Gafstat available from GAF; and inert fillers such as Nitrocellulose RS 1/2 available from Hercules. The components of the high peel strength adhesive layer can be dispersed in water or dissolved in a suitable solvent or solvent mixture. The aqueous based dispersions are generally diluted with water. Suitable organic solvents nonexclusively include acetone, methanol, diacetone alcohol, amyl acetate, n-butyl acetate, ethyl acetate, methylene chloride, chloroform, toluene, and benzene.

The high peel strength adhesive is applied to the release surface of one of the substrates mentioned above as useful for the adhesive transfer article. The high peel strength adhesive article is used by laminating it to the receiver and peeling away the substrate, thus leaving the high peel strength adhesive on the receiver.

The laminations for this invention may be conducted by putting the two materials desired to be laminated in contact and then introducing the materials into the nip of a pair of heated laminating rollers under suitable pressure. Suitable laminating temperatures usually range from approximately 60° C. to 120° C., preferably from 70° C. to 100° C. The heated rollers may have different temperatures. Then the adhesive transfer article is laminated to the high peel strength adhesive layer, and its substrate is peeled off leaving the adhesive layer and high peel strength adhesive layer on the receiver. The photosensitive layer is likewise laminated to the low peel strength adhesive layer.

The photosensitive layer is exposed by means well known in the art either before or after it is laminated to the adhesive layer. Exposure is preferably conducted after it is applied to the adhesive layer. Such exposure may be conducted by exposure to actinic radiation from a light source through a conventional halftone positive color separation under vacuum frame conditions. Mercury vapor discharge lamps are preferred over metal halide lamps. Other radiation sources, such as carbon arc, pulsed xenon, and lasers, may also be used. Light absorbing filters may be used to reduce light scattering in the materials.

After exposure and lamination of the photosensitive layer, the photosensitive layer is dry developed by stripping the support from the receiver base at room temperature with a steady, continuous motion. No devices are necessary to hold down the receiver base during stripping because only moderate manual peeling forces are needed to separate the materials. The preferred peel angle relative to the peel direction is greater than 90°. The delamination leaves the photoexposed areas of the photosensitive layer on the support and the nonexposed areas on the adhesive layer. The adhesive layer remains with the receiver base. Thus, a positive image with the adhesive remains on the receiver base.

In the preferred embodiment, another low peel strength adhesive article is then laminated to the first image on the receiver base with subsequent removal of its substrate. A second photosensitive article having a different color than the first is exposed through the appropriate color separation and laminated, in either order, to the second adhesive layer on the receiver. The support of the second photosensitive layer is then removed as was done with the first support. The second positive image with its adhesive remains with the first image. A third and a fourth image may be added in a manner similar to that used to produce the second image. In the usual case, four colored layers are employed to produce a full color reproduction of a desired image. These four colors are generally cyan, magenta, yellow, and black. The order of the colors can be varied.

A matte finish of the final image may be obtained by embossing the shiny, top surface of the image with a matte material, such as Melinex 377 from ICI. This is done by laminating together the final image and matte material. The matte material is then generally removed after lamination. The advantage of this method is that the finish of the final proof can be determined by careful selection of the matting material.

The final four color proof may be given a uniform, blanket exposure to photoharden the nonexposed, colored areas on the receiver base. A protective layer may also be laminated on top of the last dry developed layer.

The following nonlimiting examples serve to illustrate the invention.

EXAMPLE 1

The formulations for the photosensitive solutions include the following ingredients in parts by weight, as indicated.

| | Cyan | Yellow | Magenta | Black |
|---|---|---|---|---|
| Tetrahydrofuran | 200 | 200 | 200 | 200 |
| 4-Hydroxy-4-methyl-2-pentanone | 150 | 150 | 150 | 150 |
| 1-Methoxy-2-propanol | 444 | 465 | 489 | 490 |
| gamma-Butyrolactone | 44 | 65 | 89 | 90 |
| Formvar 12/85 | 6 | 13 | 18 | 9 |
| Di-pentaerythritol | 8 | 12 | 8 | 12 |

-continued

| | Cyan | Yellow | Magenta | Black |
|---|---|---|---|---|
| monohydroxy pentaacrylate | | | | |
| 2,3-di(4-methoxyphenyl)quinoxaline | 4 | 4 | 4 | 4 |
| Hostaperm B2G | 7 | — | — | — |
| Permanent Yellow GR | — | 7 | — | — |
| Permanent Red FBB | — | — | 12 | — |
| Printex 25 | — | — | — | 11 |

The pigments are dispersed in some of the binder and solvents. They are ground to the proper particle size for the correct transparency. The median diameter is less than 0.2 micrometers. The pigments are introduced into the above solutions as dispersions. The ingredients are thoroughly mixed and coated onto the adhesion pretreated side of 63 um thick Melinex 528, which is a transparent polyethylene terephthalate film with an antistat pretreatment on the other side. This film base is commercially available from ICI. The coatings are dried at 93° C. to give optical densities of 1.3, 0.9, 1.3, and 1.6 for cyan, yellow, magenta, and black, respectively.

The formulation for the adhesive solution includes the following ingredients in parts by weight, as indicated.

| | |
|---|---|
| n-Butyl acetate | 78 |
| Resoflex R-296 | 1 |
| Mowilith 30 | 21 |

The adhesive ingredients are thoroughly mixed and coated onto the nontreated side of 67 um thick Hostaphan 4756, which is a polyethylene terephthalate film with an antistat pretreatment on the other side. This film base is available from Hoechst Celanese. After drying, the adhesive layer is laminated to a 145 um thick Melinex 3020 receiver base. The temporary support for the adhesive is manually peeled off, revealing the adhesive layer. Next, the cyan photosensitive layer with its support is brought in contact with the transferred adhesive layer. The two materials are thus laminated together at 85° C. The photosensitive layer is then imagewise exposed to actinic light through a cyan positive color separation and through the support. The cyan photosensitive layer is subsequently dry developed by the removal of the support from the receiver base.

Another adhesive layer is laminated on top of the first, cyan image. The temporary support for the adhesive is removed. Next, the magenta photosensitive layer with its support is laminated to the second adhesive. After forming the photosensitive composite, the magenta photosensitive layer is imagewise exposed. The magenta image is formed by peel development like the cyan image. This is repeated for the yellow photosensitive layer and then for the black photosensitive layer. This method produces a full, four color reproduction.

EXAMPLE 2

The formulations in Example 1 are used in this example. However in this case, the solutions for the photosensitive layers are coated onto 75 um thick Melinex 505, which is an adhesion pretreated, transparent polyethylene terephthalate film commercially available from ICI. The solution for the adhesive layer is coated onto 75 um thick Melinex 516, which is a slip pretreated polyethylene terephthalate film from ICI.

The adhesive layer is laminated to a 145 um thick Melinex 3020. The temporary support for the adhesive is manually peeled off, leaving the adhesive layer on the receiver. Next, the cyan photosensitive layer with its support is brought in contact with the transferred adhesive layer. The two materials are thus laminated together at 85° C. The photosensitive layer is then imagewise exposed to actinic light through a cyan positive color separation and through the support. The cyan photosensitive layer is subsequently dry peel developed by the removal of the support from the receiver base.

Another adhesive layer is laminated on top of the first cyan image. The temporary support for the adhesive is removed. Next, the magenta photosensitive layer with its support is laminated to the second adhesive. The magenta photosensitive layer is then imagewise exposed. The magenta image is formed by peel development like the cyan image. This is repeated for the yellow photosensitive layer and then for the black photosensitive layer. This method produces a full, four color reproduction.

EXAMPLE 3

The formulations for the photosensitive solutions in Example 1 are used in this example. However, the formulation for the adhesive solution includes the following ingredients in parts by weight, as indicated.

| n-Butyl acetate | 85 |
| Mowilith 60 | 14 |
| Butvar B76 | 1 |

Butvar B76 is a polyvinyl butyral resin available from Monsanto. The photosensitive solutions are coated onto Melinex 505 and the adhesive solution is coated onto Melinex 516. The adhesive layer is laminated to Melinex 3020. The temporary support for the adhesive is manually peeled off, leaving the adhesive layer on the receiver. Next, the cyan photosensitive layer with its support is brought in contact with the transferred adhesive layer. The two materials are laminated together at 85° C. The photosensitive layer is then imagewise exposed to actinic light through a cyan positive color separation and through the support. The cyan photosensitive layer is subsequently dry peel developed by the removal of the support from the receiver base.

Another adhesive layer containing Mowilith 60 is laminated on top of the cyan image. The temporary support for the adhesive is removed. Next, the magenta photosensitive layer with its support is laminated to the second adhesive. The magenta photosensitive layer is then imagewise exposed. The magenta image is formed by peel development like the cyan image. This is repeated for the yellow photosensitive layer and then for the black photosensitive layer. This method produces a full, four color reproduction.

EXAMPLE 4

The formulations for the photosensitive solution in Example 1 are used in this example. The formulation for the adhesive solution includes the following ingredients in parts by weight, as indicated.

| Ultramid 1C | 4 |
| Mowilith 30 | 1 |

| Ethanol | 35 |
| Water | 5 |

The dry coating weight is 5 g/m$^2$.

The material is processed as in Example 3 with a difference of a laminating temperature of 100° C. instead of 85° C. A four color reproduction is produced.

EXAMPLE 5

The formulations for the photosensitive solutions in Example 1 are used in this example. The formulation for the adhesive solution includes the following ingredients in parts by weight, as indicated.

| Mowilith Ct5A | 20 |
| Ethanol | 20 |

Mowilith Ct5A is a 50% solution of a polyvinyl acetate copolymer in water, ammonia, methanol and butanol. The dry coating weight is 8 g/m$^2$. The material is processed as in Example 4 with differences of a receiver base of a Kromecote 1S instead of Melinex 3020 and a laminating temperature of 88° C. instead of 100° C.

EXAMPLE 6

The formulations for the photosensitive solutions include the following ingredients in parts by weight, as indicated.

|  | Yellow | Magenta |
| --- | --- | --- |
| Tetrahydrofuran | 200 | 200 |
| 4-Hydroxy-4-methyl-2-pentanone | 150 | 150 |
| 1-Methoxy-2-propanol | 444 | 465 |
| gamma-Butyrolactone | 44 | 65 |
| Formvar 7/95 | 5 | 9 |
| Di-pentaerythritol monohydroxy pentaacrylate | 12 | 8 |
| 2,3-di(4-methoxyphenyl)quinoxaline | 4 | 4 |
| Permanent Yellow GR | 7 | — |
| Permanent Red FBB | — | 12 |

The formulation for the adhesive solution is the same as that in Example 1. The photosensitive solutions are coated onto Melinex 505 and the adhesive solution is coated onto Melinex 516. The adhesive layer is laminated to Melinex 3020. The temporary support for the adhesive is manually peeled off, leaving the adhesive layer on the receiver. Next, the yellow photosensitive layer with its support is brought in contact with the transferred adhesive layer. The two materials are thus laminated together at 85° C. The photosensitive layer is then imagewise exposed to actinic light through a yellow positive color separation and through the support. The yellow photosensitive layer is subsequently dry peel developed by the removal of the support from the receiver base.

Another Mowilith 30 adhesive layer is laminated on top of the yellow image. The temporary support for the adhesive is removed. Next, the magenta photosensitive layer with its support is laminated to the second adhesive. The magenta photosensitive layer is then imagewise exposed. The magenta image is formed by peel development like the cyan image. This is repeated for the yellow photosensitive layer and then for the black photosensitive layer. This method produces a full, two color progressive proof.

EXAMPLE 7

The formulations for the photosensitive solutions include the following ingredients in parts by weight, as indicated.

|  | Cyan | Yellow | Magenta | Black |
|---|---|---|---|---|
| Tetrahydrofuran | 200 | 200 | 200 | 200 |
| 4-Hydroxy-4-methyl-2-pentanone | 150 | 150 | 150 | 150 |
| 1-Methoxy-2-propanol | 444 | 465 | 489 | 490 |
| gamma-Butyrolactone | 44 | 65 | 89 | 90 |
| Formvar 12/85 | 5 | 9 | 10 | 9 |
| Di-pentaerythritol monohydroxy pentaacrylate | 8 | 12 | 8 | 12 |
| 4,4-Bis(dimethylamino) benzophenone | 2 | 2 | 2 | 2 |
| 2-Mercaptobenzothiazole | 2 | 2 | 2 | — |
| Bis(2,4,5-triphenyl)imidazole | 4 | 4 | 4 | 4 |
| Hostaperm B2G | 7 | — | — | — |
| Permanent Yellow GR | — | 7 | — | — |
| Permanent Red FBB | — | — | 12 | — |
| Printex 25 | — | — | — | 11 |

The formulation for the adhesive solution is the same as that in Example 1. The photosensitive solutions are coated onto Melinex 505 and the adhesive solution is coated onto Melinex 516. The adhesive layer is laminated to Melinex 3020. The temporary support for the adhesive is manually peeled off, revealing the adhesive layer. Next, the cyan photosensitive layer with its support is brought in contact with the transferred adhesive layer. The two materials are thus laminated together at 85° C. The photosensitive layer is then imagewise exposed to actinic light through a cyan positive color separation and through the support. The cyan photosensitive layer is subsequently dry peel developed by the removal of the support from the receiver base.

Another Mowilith 30 adhesive layer is laminated on top of the first cyan image. The temporary support for the adhesive is removed. Next, the magenta photosensitive layer with its support is laminated to the second adhesive. The magenta photosensitive layer is then imagewise exposed. The magenta image is formed by peel development like the cyan image. This is repeated for the yellow photosensitive layer and then for the black photosensitive layer. This method produces a full, four color reproduction.

EXAMPLE 8

In this example, the receiver is a sheet of coated paper, namely Kromecote 1S. The formulation for the high peel strength adhesive solution includes the following ingredients in parts by weight, as indicated.

| Toluene | 90 |
|---|---|
| Elvax 150-W | 10 |

The ingredients are thoroughly mixed and coated onto a 67 um thick Melinex 516 substrate to a coating weight of 17 g/m². The substrate and the receiver sheet are then laminated together with the adhesive layer in between, through a set of pressure rollers having a temperature of 75° C. and a linear speed of 56 cm/min. The substrate is peeled off, leaving the high peel strength adhesive on the receiver. The peel strength is 150 g/in.

The formulations for the photosensitive solutions and adhesive solution in Example 3 are used in this example. The first adhesive is laminated at 75° C. to the high peel strength adhesive layer. The temporary support for the adhesive is manually peeled off, leaving the adhesive layer on the paper receiver. Next, the cyan photosensitive layer is transferred to this adhesive layer, exposed, and subsequently peel developed with removal of the support. The other three colors are processed as in Example 3, with a difference of a laminating temperature of 75° C. instead of 85° C.

What is claimed is:

1. A method for producing a positive image on a single sheet which comprises, in order:

a) providing a receiver sheet; and b) providing a high peel strength adhesive article, said high peel strength adhesive article comprising a substrate having a release surface and a high peel strength adhesive layer on said release surface, which high peel strength adhesive layer comprises a thermoplastic resin or resins having a peel strength of greater than 100 g/inch when adhered to said receiver sheet; and c) laminating said high peel strength adhesive layer to the receiver sheet with pressure at a temperature in the range of from about 60° C. to about 120° C.; and d) peeling apart said substrate and receiver sheet, thereby transferring the high peel strength adhesive layer to the receiver sheet; and e) providing an adhesive transfer article comprising a substrate having a release surface and an adhesive layer on said release surface, which adhesive layer comprises a thermoplastic resin or resins; and f) laminating said adhesive transfer article via the adhesive layer to the high peel strength adhesive layer on the receiver sheet with pressure at a temperature in the range of from about 60° C. to about 120° C.; and g) peeling apart the substrate and the receiver sheet, thereby transferring the adhesive layer from the substrate to the high peel strength adhesive layer on the receiver sheet; and h) providing a photosensitive article which comprises a transparent support and a photosensitive composition layer on said support, said photosensitive composition comprising an organic binding resin, a colorant, a photoinitiator, and a free radical polymerizable acrylate or methacrylate component having at least two ethylenically unsaturated groups; wherein the binding resin is present in sufficient amount to bind the composition components into a uniform film; wherein the colorant is present in sufficient amount to uniformly color the composition; wherein the photoinitiator is present in sufficient amount of initiate the free radical polymerization of the polymerizable component upon exposure to sufficient actinic radiation; and wherein the polymerizable component is present in sufficient amount to provide an image differentiation when the composition is exposed to actinic radiation; and i) either i) laminating the photosensitive composition layer to the adhesive layer on the receiver sheet and thereafter imagewise exposing the photosensitive composition layer to sufficient actinic radiation to provide an image differentiation; or ii) imagewise exposing the photosensitive composition layer to sufficient actinic radiation to provide an image differentiation and thereafter laminating the photosensitive composition layer to the adhesive layer on the receiver sheet; and thereafter j) peeling apart the transparent support and the receiver sheet such that the imagewise nonexposed portions of the photosensitive composition are transferred to the adhesive layer on the receiver sheet, thereby producing a positive image on the receiver sheet, while the imagewise exposed portions remain on the transparent support.

2. The method of claim 1 further comprising the subsequent steps of:
I) providing another adhesive transfer article according to step (e); and
II) laminating said another adhesive transfer article via its adhesive layer to the previously prepared positive image on the receiver sheet, with pressure at a temperature in the range of from about 60° C. to about 120° C.; and
III) peeling apart the substrate from said another adhesive transfer article and the receiver sheet, thereby transferring the full adhesive layer from the substrate to the previously prepared positive image on the receiver sheet; and
IV) providing another photosensitive article according to step (h), having a different colorant; and
V) either
i) laminating the photosensitive composition layer of said another photosensitive article to the adhesive layer on the receiver sheet provided in step (III), and thereafter imagewise exposing said photosensitive composition layer to sufficient actinic radiation to provide an imagewise differentiation; or
ii) imagewise exposing the photosensitive composition layer of said another photosensitive article to sufficient actinic radiation to provide an imagewise differentiation and thereafter laminating said photosensitive composition layer to the adhesive layer on the receiver sheet provided in step (III); and thereafter
VI) peeling apart the transparent support of said another photosensitive article and the receiver sheet such that the imagewise nonexposed portions of the photosensitive composition layer are transferred to the adhesive layer on the receiver sheet thereby producing another positive image on the receiver sheet, while the imagewise exposed portions remain on said transparent support.

3. The method of claim 2 further comprising repeating steps (I) and (VI) at least once, wherein an additional adhesive transfer article provided according to step (I) is laminated via its adhesive layer to the previously prepared positive image on the receiver sheet according to step (II); and peeling apart the substrate from said additional adhesive transfer article and the receiver sheet, thereby transferring the adhesive layer from said substrate to the previously prepared positive image on the receiver sheet according to step (III); and providing an additional photosensitive article according to step (IV) having an additional different colorant; and exposing and laminating the additional photosensitive article according to step (V); and thereafter peeling apart the transparent support of said additional photosensitive article and the receiver sheet such that the imagewise nonexposed portions of the photosensitive composition layer of the additional photosensitive article are transferred to said adhesive layer on the receiver sheet thereby producing an additional positive image on the receiver sheet, while the imagewise exposed portions remain on the transparent support.

4. The method of claim 1 wherein the said receiver sheet comprises paper, coated paper, or a polymeric film.

5. The method of claim 1 wherein the high peel strength adhesive layer comprises a resin or resins with glass transition temperatures of from about −20° C. to about 25° C.

6. The method of claim 5 wherein said high peel strength adhesive layer comprises polyvinyl acetate or a copolymer containing vinyl acetate groups.

7. The method of claim 1 wherein said adhesive layer comprises one or more thermoplastic polymers having a softening temperature in the range of about 40° C. to about 200° C.

8. The method of claim 1 wherein said adhesive layer comprises a resin or resins with glass transition temperatures of from about −25° C. to about 100° C.

9. The method of claim 1 wherein said adhesive layer comprises a polyvinyl acetate polymer or copolymer containing vinyl acetate.

10. The method of claim 1 wherein said adhesive layer further comprises one or more ingredients selected from the group consisting of UV absorbers, antistatic compositions, optical brighteners, inert fillers, surfactants, release agents, residual solvents, monomers, elastomers and plasticizers.

11. The method of claim 1 wherein the said adhesive transfer article comprises a polymeric film substrate, and the adhesive layer comprises a polyvinyl acetate.

12. The method of claim 1 wherein the photosensitive article comprises a transparent support having an adhesion promoted surface adjacent to the photosensitive composition layer.

13. The method of claim 12 wherein said transparent support comprises polyethylene terephthalate.

14. The method of claim 1 wherein said photosensitive composition comprises one or more monomers selected from the group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerythritol triacrylate, bisphenol A ethoxylate dimethacrylate, trimethylolpropane ethoxylate triacrylate, and trimethylolpropane propoxylate triacrylate.

15. The method of claim 1 wherein said photosensitive composition comprises one or more photoinitiators selected from the group consisting of 2,3-(di-4-methoxyphenyl) quinoxaline, 9-phenylacridine, bis(2,4,5-triphenyl) imidazole, and their derivatives.

16. The method of claim 1 wherein said photosensitive composition comprises one or more colorants selected from the group consisting of dyes and pigments.

17. The method of claim 1 wherein said photosensitive composition comprises one or more binding resins selected from the group consisting of styrene/maleic anhydride copolymers and their half esters; acrylic polymers and copolymers; polyamides; polyvinyl pyrrolidones; cellulosic resins; phenolic resins; and polyvinyl acetals.

18. The method of claim 17 wherein said polyvinyl acetal is a polyvinyl formal polymer or a copolymer containing vinyl formal.

19. The method of claim 1 wherein said photosensitive composition further comprises one or more ingredients selected from the group consisting of spectral sensitizers, thermal polymerization inhibitors, plasticizers, oligomers, surfactants, inert fillers, antihalation agents, hydrogen atom donors, photoactivators, and optical brightening agents.

20. The method of claim 1 further comprising the subsequent step of providing a protective covering of the image on the receiver sheet.

21. The method of claim 1 further comprising the subsequent step of performing a uniform blanket exposure of actinic radiation to the image.

22. The method of claim 1 wherein the said receiver sheet comprises paper, coated paper, or a polymeric film; and wherein the high peel strength adhesive layer comprises a polyvinyl acetate polymer or a copolymer containing vinyl acetate groups, with a glass transition temperature of from about −20° C. to about 25° C.; the adhesive layer comprises a polyvinyl acetate polymer or copolymer containing vinyl acetate with glass transition temperatures of from about −25° C. to about 100° C.; wherein the photosensitive article comprises a polyethylene terephthalate transparent support having an adhesion promoted surface adjacent to the photosensitive composition layer; wherein said photosensitive composition comprises dipentaerythritolmonohydroxypentaacrylate, 2,3-(di-4-methoxyphenyl)quinoxaline, and a polyvinyl formal polymer or a copolymer containing vinyl formal.

* * * * *